United States Patent
Seo et al.

(10) Patent No.: US 8,120,054 B2
(45) Date of Patent: Feb. 21, 2012

(54) LIGHT EMITTING DIODE PACKAGE HAVING HEAT DISSIPATING SLUGS

(75) Inventors: Tae Won Seo, Ansan-si (KR); Sang Cheol Lee, Ansan-si (KR); Chan Sung Jung, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 144 days.

(21) Appl. No.: 12/204,619

(22) Filed: Sep. 4, 2008

(65) Prior Publication Data

US 2009/0057704 A1 Mar. 5, 2009

(30) Foreign Application Priority Data

Sep. 4, 2007 (KR) .................. 10-2007-0089351

(51) Int. Cl.
*H01L 33/00* (2010.01)
(52) U.S. Cl. ............ 257/99; 257/98; 257/100; 257/708; 257/722
(58) Field of Classification Search .................. 257/98, 257/99, 100
See application file for complete search history.

(56) References Cited

U.S. PATENT DOCUMENTS

| | | | |
|---|---|---|---|
| 7,087,937 B2 * | 8/2006 | Liu | 257/99 |
| 7,352,582 B2 * | 4/2008 | Yokoyama | 361/703 |
| 2005/0068776 A1 * | 3/2005 | Ge | 362/296 |
| 2006/0102922 A1 | 5/2006 | Wu et al. | |
| 2006/0124953 A1 * | 6/2006 | Negley et al. | 257/99 |
| 2006/0169999 A1 * | 8/2006 | Park et al. | 257/99 |
| 2006/0203510 A1 * | 9/2006 | Noh et al. | 362/580 |
| 2007/0019416 A1 | 1/2007 | Han et al. | |
| 2007/0252161 A1 * | 11/2007 | Meis et al. | 257/88 |

FOREIGN PATENT DOCUMENTS

| | | |
|---|---|---|
| EP | 1732144 | 12/2006 |
| EP | 2034526 | 3/2009 |
| WO | 2005/043627 | 5/2005 |

OTHER PUBLICATIONS

Extended European Search Report issued on Oct. 6, 2011 in European Patent Application No. 08015539.3

* cited by examiner

*Primary Examiner* — Wai Sing Louie
*Assistant Examiner* — Bilkis Jahan
(74) *Attorney, Agent, or Firm* — H.C. Park & Associates, PLC

(57) ABSTRACT

A light emitting diode package having heat dissipating slugs is provided. The light emitting diode package comprises first and second heat dissipating slugs formed of a conductive material and spaced apart from each other; a package main body coupled to the first and second heat dissipating slugs to support the first and second heat dissipating slugs; and a light emitting diode die electrically connected to the first and second heat dissipating slugs, wherein the respective first and second heat dissipating slugs are exposed to the outside through lower and side surfaces of the package main body. As such, the first and second heat dissipating slugs can be used as external leads.

15 Claims, 2 Drawing Sheets

[Fig. 1]
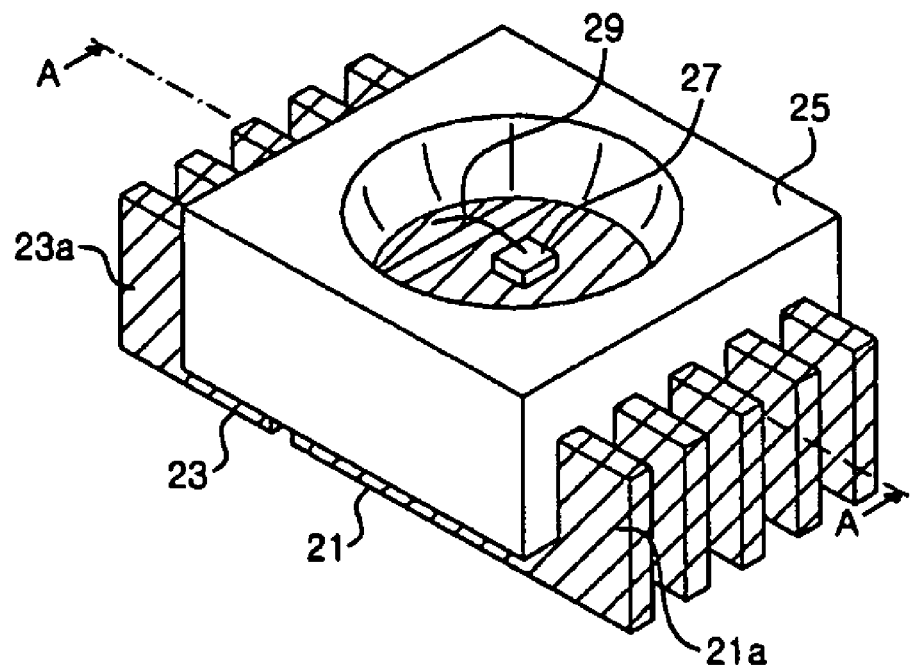
[Fig. 2]
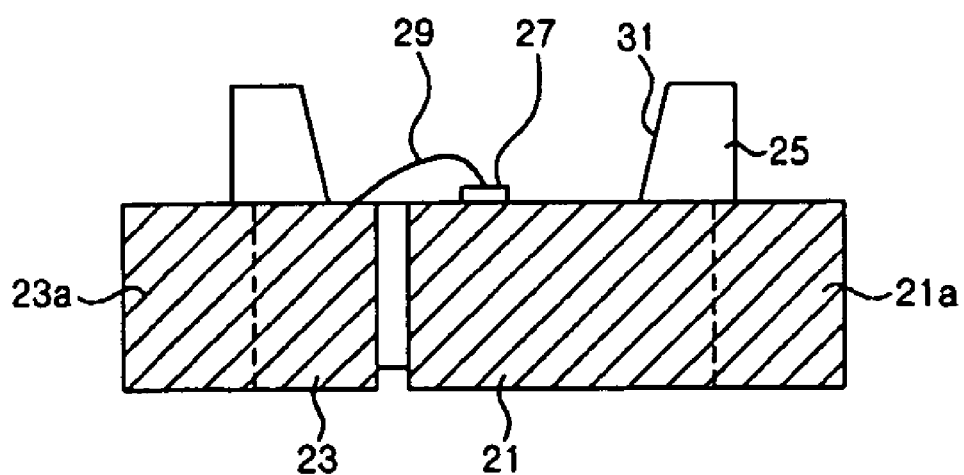

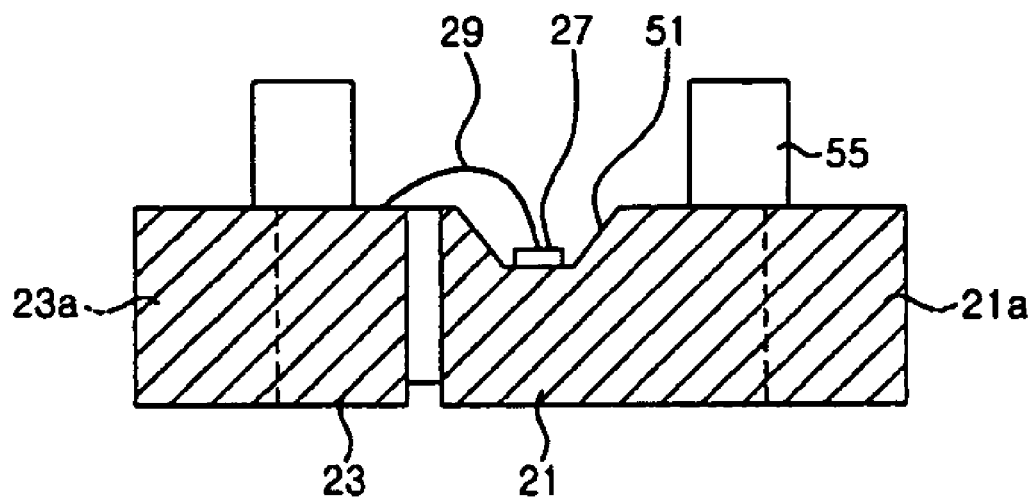
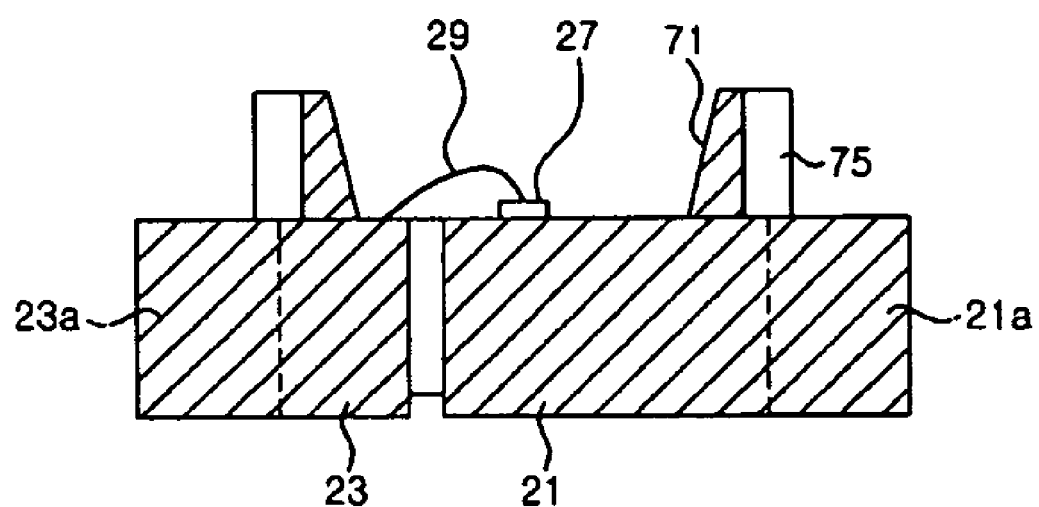

LIGHT EMITTING DIODE PACKAGE HAVING HEAT DISSIPATING SLUGS

FIELD OF THE INVENTION

The present invention relates to a light emitting diode package, and more particularly, to a light emitting diode package having heat dissipating slugs.

BACKGROUND OF THE INVENTION

Recently, a gallium nitride based light emitting diode (LED) die have been increasingly used as a light source. The optical power of such a light emitting diode is generally proportional to a magnitude of an input current. Accordingly, if the magnitude of the input current supplied to the light emitting diode is increased, high optical power can be obtained. However, the increase in the magnitude of the input current causes the junction temperature of the light emitting diode to increase. The increase in the junction temperature of the light emitting diode causes a photometric efficiency to be reduced, wherein the photometric efficiency indicates what portion of an input energy is converted into visible light. Accordingly, it is required to prevent the increase in the junction temperature of the light emitting diode due to the increase in the magnitude of the input current.

Conventionally, in order to prevent junction temperature of a light emitting diode from being increased, a package has been used in which a heat sink is coupled to a lead frame to thereby dissipate heat through the heat sink. However, since the package is manufactured by coupling a separate heat sink to the lead frame, there is a problem in that a structure of the package and therefore a process of manufacturing the same may be complicated, and thus, the manufacturing cost of the package may be increased.

SUMMARY OF THE INVENTION

An object of the present invention is to provide a light emitting diode package having an improved heat dissipation performance.

Another object of the present invention is to provide a light emitting diode package having a simple structure as well as easily dissipating heat generated from a light emitting diode die.

According to the present invention for achieving the objects, there is provided a light emitting diode package having heat dissipating slugs. The light emitting diode package comprises first and second heat dissipating slugs spaced apart from each other. The first and second heat dissipating slugs are formed of a conductive material. A package main body is coupled to the first and second heat dissipating slugs to support the first and second heat dissipating slugs. Further, a light emitting diode die is electrically connected to the first and second heat dissipating slugs. In the meantime, the respective first and second heat dissipating slugs are exposed to the outside through lower and side surfaces of the package main body. As such, the first and second heat dissipating slugs can be used as external leads, so that the light emitting package with a simple structure can be provided. Further, since heat can be dissipated through the first and second heat dissipating slugs, whereby the heat dissipation performance can be improved.

Further, portions of the first and second heat dissipating slugs which are exposed through the side surfaces of the package main body may include a plurality of fins. The fins cause the surface area of the first and second heat dissipating slugs to be increased, so that the heat dissipation performance can be improved.

According to some embodiments of the present invention, the package main body may have a cavity for exposing upper surfaces of the first and second heat dissipating slugs. The light emitting diode die may be mounted on the upper surface of the first heat dissipating slug exposed through the cavity. In addition, a bonding wire can electrically connect the light emitting diode die to the second heat dissipating slug.

Meanwhile, the package main body may be formed of transparent resin. In such a case, the package main body can cover the light emitting diode die and/or the bonding wire.

According to some embodiments of the present invention, the first heat dissipating slug may have a cavity functioning as a reflective surface. The light emitting diode die is mounted in the cavity of the first heat dissipating slug.

According to another embodiment of the present invention, a metal reflector may be positioned on the first and second heat dissipating slugs, wherein the light emitting diode die may be mounted inside of the metal reflector. Accordingly, heat can be discharged through the metal reflector, whereby the heat dissipation performance can be further improved. The package main body can be attached to the metal reflector to support the metal reflector.

BRIEF DESCRIPTION OF THE DRAWINGS

FIG. 1 is a perspective view illustrating a light emitting diode package having heat dissipating slugs according to an embodiment of the present invention.

FIG. 2 is a sectional view taken along line A-A of FIG. 1.

FIG. 3 is a sectional view illustrating a light emitting diode package having heat dissipating slugs according to another embodiment of the present invention.

FIG. 4 is a sectional view illustrating a light emitting diode package having heat dissipating slugs according to a further embodiment of the present invention.

DETAILED DESCRIPTION OF THE PRESENT INVENTION

Hereinafter, preferred embodiments of the present invention will be described in detail with reference to the accompanying drawings.

FIG. 1 is a perspective view illustrating a light emitting diode package having heat dissipating slugs according to an embodiment of the present invention, and FIG. 2 is a sectional view taken along line A-A of FIG. 1.

Referring to FIGS. 1 and 2, the light emitting diode package according to this embodiment includes first and second heat dissipating slugs 21 and 23, a package main body 25 and a light emitting diode die 27.

The first and second heat dissipating slugs 21 and 23 are spaced apart from each other, thereby being electrically insulated from each other. The first and second heat dissipating slugs 21 and 23 may be formed of a conductive material, e.g., a pure metal such as copper, silver, nickel, aluminum and molybdenum, a metal alloy thereof, or a complex material thereof. Such heat dissipating slugs are also thermally conductive and have relatively large volumes, so that heat generated from the light emitting diode die 27 can be easily dissipated.

Meanwhile, the package main body 25 is coupled to the first and second heat dissipating slugs 21 and 23, thereby supporting them. The package main body 25 may be formed of a plastic or ceramic material and defines the whole shape of the light emitting diode package. Each of the first and second heat dissipating slugs 21 and 23 is exposed to the outside through lower and side surfaces of the package main body 25. At this time, portions of the first and second heat dissipating slugs 21 and 23, which are exposed through the side surfaces of the package main body 25, may be provided with a plurality of fins 21a and 23a, respectively. The fins 21a and 23a cause a surface area of the first and second heat dissipating slugs 21 and 23 to be increased and thus help the heat dissipating slugs to be cooled, thereby improving the heat dissipation efficiency of the light emitting diode package.

In the meantime, the light emitting diode die 27 is electrically connected to the first and second heat dissipating slugs 21 and 23. For example, the light emitting diode die 27 may be electrically connected to the first heat dissipating slug 21 through a conductive adhesive (not shown) and electrically connected to the second heat dissipating slug 23 through a bonding wire 29. Alternatively, the light emitting diode die 27 may be mounted on the first heat dissipating slug 21 through an adhesive and electrically connected to the first and second heat dissipating slugs 21 and 23 through bonding wires, respectively.

Meanwhile, the package main body 25 may be formed of transparent resin. In such a case, the package main body 25 may cover the light emitting diode die 27 and the bonding wire 29. The transparent resin may contain a phosphor for converting a wavelength of light emitted from the light emitting diode die 27. Alternatively, if the package main body 25 is formed of opaque plastic or ceramic, the package main body 25 has a cavity for exposing upper surfaces of the first and second heat dissipating slugs 21 and 23 to the outside. At this time, the light emitting diode die 27 may be mounted on the upper surface of the first heat dissipating slug 21 which is exposed through the cavity and electrically connected to the second heat dissipating slug 23 through the bonding wire 29. Further, the cavity may be filled with transparent resin (not shown), which may contain a phosphor.

An inner wall 31 of the cavity is configured to be slanted thereby functioning as a reflective surface for reflecting the light emitted from the light emitting diode die 27. Further, the inner wall 31 may be coated with a reflective material in order to increase the optical reflectivity.

FIG. 3 is a sectional view illustrating a light emitting diode package having heat dissipating slugs according to another embodiment of the present invention.

Referring to FIG. 3, the light emitting diode package according to this embodiment has the substantially same configuration as the light emitting diode package illustrated with reference to FIGS. 1 and 2, but is different in that a first heat dissipating slug 21 shown in FIG. 3 has a cavity which forms a reflective surface 51. The light emitting diode die 27 is mounted in the cavity. Meanwhile, as illustrated with reference to FIGS. 1 and 2, a package main body 55 may be formed of plastic or ceramic. If the package main body 55 is formed of opaque plastic or ceramic, the package main body 55 has a cavity for exposing the cavity of the first heat dissipating slug 21.

Generally, if the light emitted from the light emitting diode die 27 is directly incident on a plastic material, the light may cause the plastic to be deteriorated, e.g., structurally deformed or discolored. Accordingly, if the package main body 55 is formed of a plastic material, the light may cause the package main body 55 to be deteriorated, so that the reflectivity of the inner wall 31 of the cavity (see FIG. 2) may be reduced. However, according to this embodiment, the first heat dissipating slug 21 is formed with the reflective surface, so that the package main body 55 can be prevented from being deteriorated due to the light emitted from the light emitting diode die 27. Further, the first heat dissipating slug 21 is formed of a metal with high reflectivity, so that the light emitting efficiency of the light emitting diode package can be improved.

FIG. 4 is a sectional view illustrating a light emitting diode package having heat dissipating slugs according to a further embodiment of the present invention.

Referring to FIG. 4, the light emitting diode package according to this embodiment has the substantially same structure as the light emitting diode package illustrated with reference to FIGS. 1 and 2, but is different in that the light emitting diode package shown in FIG. 4 further includes a metal reflector 71. The light emitting diode die 27 is mounted in the metal reflector 71. Accordingly, the light emitted from the light emitting diode die 27 is reflected from an inner surface of the metal reflector 71 and then exits to the outside.

The metal reflector 71 may be formed of the same material as the first and second heat dissipating slugs 21 and 23, but the present invention is not limited thereto. For example, the metal reflector 71 may be formed of a variety of metal materials with high reflectivity, such as silver, aluminum, nickel or the like.

Meanwhile, a package main body 75 may be not only coupled to the first and second heat dissipating slugs 21 and 23 to support them but also attached to the metal reflector 71 to support it. Further, the metal reflector 71 may be attached to the first and second heat dissipating slugs 21 and 23.

According to this embodiment, the employment of the metal reflector 71 prevents the package main body 75 from being deteriorated and increases the reflectivity of the light emitted from the light emitting diode die 27. Further, heat can be discharged to the outside through the metal reflector 71, so that the heat dissipation performance can be improved.

According to the embodiments of the present invention, the heat dissipating slugs can be used as external leads, so that the light emitting package with a simple structure can be provided. Further, since the first and second heat dissipating slugs are exposed to the outside through both side surfaces of the package main body and the lower surface thereof, whereby the heat dissipation performance of the light emitting diode package can be improved.

What is claimed is:

1. A light emitting diode package, comprising:
   first and second heat dissipating slugs formed of a conductive material and spaced apart from and not directly electrically connected to each other;
   a package main body coupled to the first and second heat dissipating slugs to support the first and second heat dissipating slugs; and
   a light emitting diode die electrically connected to the first and second heat dissipating slugs,
   wherein the respective first and second heat dissipating slugs are exposed to the outside through lower and side surfaces of the package main body.

2. The light emitting diode package as claimed in claim 1, wherein portions of the first and second heat dissipating slugs which are exposed through the side surfaces of the package main body include a plurality of fins.

3. The light emitting diode package as claimed in claim 1, wherein the package main body has a cavity for exposing upper surfaces of the first and second heat dissipating slugs, and the light emitting diode die is mounted on the upper surface of the first heat dissipating slug exposed through the cavity.

4. The light emitting diode package as claimed in claim 3, further comprising a bonding wire for electrically connecting the light emitting diode die to the second heat dissipating slug.

5. The light emitting diode package as claimed in claim 1, wherein the package main body is formed of transparent resin.

6. The light emitting diode package as claimed in claim 1, wherein the first heat dissipating slug has a cavity forming a reflective surface, and the light emitting diode die is mounted in the cavity of the first heat dissipating slug.

7. The light emitting diode package as claimed in claim 1, further comprising a metal reflector positioned on the first and second heat dissipating slugs, wherein the light emitting diode die is mounted inside of the metal reflector.

8. The light emitting diode package as claimed in claim 7, wherein the package main body is attached to the metal reflector to support the metal reflector.

9. The light emitting diode package as claimed in claim 1, wherein the first and second heat dissipating slugs are partially embedded in the package main body.

10. The light emitting diode package as claimed in claim 1, wherein the package main body comprises a first side and a second side opposite to the first side along a first direction, and the first and second heat dissipating slugs are partially embedded in the package main body between the first side and the second side.

11. The light emitting diode package as claimed in claim 10, wherein the first heat dissipating slug extends outside the first side of the package main body, and the second heat dissipating slug extends outside the second side of the package main body.

12. The light emitting diode package as claimed in claim 10, wherein the package main body comprises a third side, and the first and second heat dissipating slugs are partially covered by the package main body and extend from the third side of the package body in a second direction substantially perpendicular to the first direction.

13. A light emitting diode package, comprising:
   first and second heat dissipating slugs formed of a conductive material and spaced apart from each other;
   a package main body coupled to the first and second heat dissipating slugs to support the first and second heat dissipating slugs; and
   a light emitting diode die electrically connected to the first and second heat dissipating slugs,
   wherein the respective first heat dissipating slug and the second heat dissipating slug are exposed to and extend outside the package main body through a lower surface and a side surface of the package main body.

14. The light emitting diode package of claim 13, wherein the light emitting diode die is disposed on the first heat dissipating slug, and the light emitting diode die and the second heat dissipating slug are connected.

15. A light emitting diode package, comprising:
   first and second heat dissipating slugs formed of a conductive material and spaced apart from each other;
   a package main body coupled to the first heat dissipating slug and the second heat dissipating slug to support the first heat dissipating slug and the second heat dissipating slug; and
   a light emitting diode die electrically connected to the first heat dissipating slug and the second heat dissipating slug,
   wherein the respective first heat dissipating slug and the second heat dissipating slug are exposed to outside the package main body through a lower surface and a side surface of the package main body, and
   wherein the light emitting diode die is disposed on the first heat dissipating slug and the light emitting diode die and the second heat dissipating slug are connected.

* * * * *